(12) United States Patent
Tsai et al.

(10) Patent No.: US 7,855,443 B2
(45) Date of Patent: Dec. 21, 2010

(54) STACK STRUCTURE OF SEMICONDUCTOR PACKAGES AND METHOD FOR FABRICATING THE STACK STRUCTURE

(75) Inventors: Fang-Lin Tsai, Taichung (TW); Ho-Yi Tsai, Taichung Hsien (TW); Han-Ping Pu, Taichung (TW); Cheng-Hsu Hsiao, Taichung Hsien (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 842 days.

(21) Appl. No.: 11/732,853

(22) Filed: Apr. 4, 2007

(65) Prior Publication Data

US 2007/0246811 A1 Oct. 25, 2007

(30) Foreign Application Priority Data

Apr. 24, 2006 (TW) .............................. 95114501 A

(51) Int. Cl.
*H01L 23/02* (2006.01)
(52) U.S. Cl. .................. 257/686; 257/690; 257/738; 257/779; 257/780; 257/E23.003; 257/E23.02
(58) Field of Classification Search .................. 257/686, 257/687, 779, 678, 777, 780, 738, 685, 690, 257/E23.003, E23.02, E23.021
See application file for complete search history.

(56) References Cited

U.S. PATENT DOCUMENTS 5,222,014 A 6/1993 Lin 6,987,314 B1 1/2006 Yoshida et al.
2007/0246813 A1\* 10/2007 Ong et al. .................. 257/686

FOREIGN PATENT DOCUMENTS

TW I250627 3/2006

\* cited by examiner

*Primary Examiner*—Matthew E Warren
(74) *Attorney, Agent, or Firm*—Peter F. Corless; Steven M. Jensen; Edwards Angell Palmer & Dodge LLP

(57) ABSTRACT

A stack structure of semiconductor packages and a method for fabricating the stack structure are provided. A plurality of electrical connection pads and dummy pads are formed on a surface of a substrate of an upper semiconductor package and at positions corresponding to those around an encapsulant of a lower semiconductor package. Solder balls are implanted to the electrical connection pads and the dummy pads. The upper semiconductor package is mounted on the lower semiconductor package. The upper semiconductor package is electrically connected to the lower semiconductor package by the solder balls implanted to the electrical connection pads, and the encapsulant of the lower semiconductor package is surrounded and confined by the solder balls implanted to the dummy pads. Thereby, the upper semiconductor package is properly and securely positioned on the lower semiconductor package, without the occurrence of misalignment between the upper and lower semiconductor packages.

4 Claims, 6 Drawing Sheets

“STACK STRUCTURE OF SEMICONDUCTOR PACKAGES AND METHOD FOR FABRICATING THE STACK STRUCTURE”

FIELD OF THE INVENTION

The present invention relates to semiconductor packages and methods for fabricating the same, and more particularly, to a stack structure of semiconductor packages and a method for fabricating the stack structure.

BACKGROUND OF THE INVENTION

In response to electronic products that are being developed to have multi-functionality, high electrical performance and high operating speed nowadays, semiconductor manufacturers endeavor to provide semiconductor devices integrating a plurality of chips or packages as required for the electronic products.

FIG. 1 shows a stack structure of semiconductor packages disclosed in U.S. Pat. No. 5,222,014. A ball grid array (BGA) substrate 11 with bond pads 110 formed on an upper surface thereof is provided, and a semiconductor chip 10 is mounted on the BGA substrate 11 and encapsulated by an encapsulant 13, so as to form a first semiconductor package 101. Then, a second semiconductor package 102 is mounted and electrically connected to the bond pads 110 of the substrate 11 of the first semiconductor package 101 by solder balls 14, so as to form a stack structure of semiconductor packages.

However, in the above stack structure of semiconductor packages, when the second semiconductor package is mounted to the bond pads of the substrate of the first semiconductor package by the solder balls and is subjected to a reflow process to make the solder balls bonded and electrically connected to the bond pads, misalignment of the second semiconductor package with respect to the first semiconductor package usually occurs because the solder balls become melted and softened during the reflow process, thereby leading to a failure of electrical connection between the first and second semiconductor packages.

Accordingly, U.S. Pat. No. 6,987,314 discloses another stack structure of semiconductor packages as shown in FIG. 2. In this stack structure, a pre-solder material 22 is disposed on bond pads of a substrate of a first semiconductor package 201. When a second semiconductor package 202 is mounted on the first semiconductor package 201 by solder balls 24 that are reflowed to the pre-solder material 22, self-alignment between the pre-solder material 22 and the solder balls 24 can properly position the second semiconductor package 202 on the first semiconductor package 201. However, the provision of the pre-solder material on the bond pads of the substrate of the first semiconductor package increases not only the fabrication costs but also complexity of the fabrication processes for the stack structure.

Taiwan Patent No. I250627 discloses another stack structure of semiconductor packages as shown in FIG. 3. In this stack structure, a second semiconductor package 302 is electrically connected to a first semiconductor package 301 by a plurality of solder balls 34, and infrared paste (IR paste) 35 is provided between a substrate 311 of the first semiconductor package 301 and a substrate 312 of the second semiconductor package 302. Then, infrared irradiation is performed to adhere the second semiconductor package 302 to the first semiconductor package 301 by the IR paste 35. However, the provision of the IR paste on the substrate of the first semiconductor package and performing the infrared irradiation to adhere the second semiconductor package to the first semiconductor package both undesirably increase the fabrication costs and complexity of the fabrication processes for the stack structure.

Therefore, the problem to be solved here is to provide a stack structure of semiconductor packages and a method for fabricating the same, so as to prevent the misalignment problem caused by a reflow process when using solder balls to electrically connect and stack semiconductor packages, and avoid increase in fabrication costs and process complexity due to the use of a pre-solder material disposed on bond pads of a substrate of a lower semiconductor package or due to the use of IR paste provided between substrates of upper and lower semiconductor packages.

SUMMARY OF THE INVENTION

In view of the aforesaid drawbacks of the prior art, an objective of the present invention is to provide a stack structure of semiconductor packages and a method for fabricating the stack structure, so as to prevent misalignment between the semiconductor packages during a reflow process when the semiconductor packages are stacked.

Another objective of the present invention is to provide a stack structure of semiconductor packages and a method for fabricating the stack structure without the use of a pre-solder materials disposed on bond pads of a substrate of a lower semiconductor package so as not to increase the fabrication costs and complexity of the fabrication processes.

A further objective of the present invention is to provide a stack structure of semiconductor packages and a method for fabricating the stack structure without the use of an infrared paste provided between substrates of upper and lower semiconductor packages and without the need of performing infrared irradiation so as not to increase the fabrication costs and complexity of the fabrication processes.

In accordance with the above and other objectives, the present invention proposes a method for fabricating a stack structure of semiconductor packages, comprising the steps of: providing a substrate having a first surface and a second surface opposite to the first surface, wherein a plurality of electrical connection pads and dummy pads are formed on the second surface of the substrate; mounting and electrically connecting at least one semiconductor chip to the first surface of the substrate; implanting solder balls to the electrical connection pads and the dummy pads of the second surface of the substrate, thereby forming an upper semiconductor package; and mounting the upper semiconductor package on a fabricated lower semiconductor package, wherein the lower semiconductor package comprises a substrate, a semiconductor chip mounted on and electrically connected to the substrate, and an encapsulant formed on the substrate and encapsulating the semiconductor chip, wherein the upper semiconductor package is electrically connected to the substrate of the lower semiconductor package by the solder balls implanted to the electrical connection pads, and the solder balls implanted to the dummy pads surround and confine the encapsulant of the lower semiconductor package, so as to form the stack structure of the semiconductor packages. Further, the dummy pads of the upper semiconductor packager are formed at positions corresponding to those around the encapsulant of the lower semiconductor package. In practical implementation, the dummy pads can be adjusted in location and number flexibly as required, as long as at least one dummy pad is provided at a position corresponding to that closely adjacent to each edge of the encapsulant of the lower semiconductor package. For example, the dummy pads can be located at positions corresponding to those closely adjacent to a middle portion, one end or two ends of each edge of the encapsulant, or can be located at positions corresponding to those closely adjacent to corners of the encapsulant and further extended along the edges forming the corners of the encapsulant, so as to allow the solder balls to be implanted to the dummy pads to form a positioning mechanism.

The present invention also proposes a stack structure of semiconductor packages, comprising: a lower semiconductor package, which comprises a substrate, a semiconductor chip mounted on and electrically connected to the substrate, and an encapsulant formed on the substrate and encapsulating the semiconductor chip; and an upper semiconductor package disposed on the lower semiconductor package, wherein the upper semiconductor package comprises a substrate having a first surface and a second substrate opposite to the first surface, a semiconductor chip mounted on and electrically connected to the first surface of the substrate, a plurality of electrical connection pads and dummy pads formed on the second surface of the substrate, and solder balls implanted to the electrical connection pads and the dummy pads, wherein the upper semiconductor package is electrically connected to the substrate of the lower semiconductor package by the solder balls implanted to the electrical connection pads, and the solder balls implanted to the dummy pads surround and confine the encapsulant of the lower semiconductor package.

Therefore, in the stack structure of semiconductor packages and the method for fabricating the stack structure according to the present invention, a plurality of electrical connection pads serving as electrical input/output (I/O) pads and a plurality of dummy pads are formed on the second surface of the upper semiconductor package, wherein the positions of the dummy pads correspond to those around the encapsulant of the lower semiconductor package. Thus, when the upper semiconductor package is mounted on the lower semiconductor package, the upper semiconductor package can be electrically connected to the lower semiconductor package by the solder balls implanted to the electrical connection pads, and the encapsulant of the lower semiconductor package can be surrounded and confined by the solder balls implanted to the dummy pads, so as to effectively and properly position the upper semiconductor package on the lower semiconductor package, thereby avoiding misalignment during a reflow process and electrical connection failure for stacking semiconductor packages in the prior art.

Moreover, the solder balls on the dummy pads to form the positioning mechanism are implanted together with the solder balls on the electrical connection pads, such that no additional fabrication process is required. Compared with the prior art using a pre-solder material provided on the substrate of the lower semiconductor package, or applying infrared paste between the substrates of the upper and lower semiconductor package and performing infrared irradiation so as to positioning the stacked upper and lower semiconductor packages, the present invention without the use of the pre-solder material, infrared paste and infrared irradiation, effectively avoids increase in the fabrication costs and complexity of the fabrication processes.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

Preferred embodiments of a stack structure of semiconductor packages and a method for fabricating the stack structure as proposed in the present invention are described as follows with reference to FIGS. 4 to 9. It should be understood that the drawings are simplified schematic diagrams only showing the elements relevant to the present invention, and the layout of elements could be more complicated in practical implementation.

First Embodiment

FIGS. 4A to 4D are cross-sectional views of a stack structure of semiconductor packages and a method for fabricating the stack structure in accordance with a first embodiment of the present invention.

Figure 1:
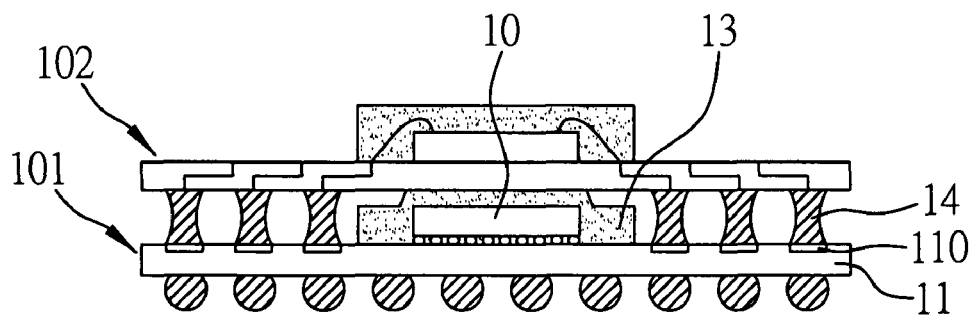
FIG. 1 (PRIOR ART) is a cross-sectional view of a stack structure of semiconductor packages disclosed in U.S. Pat. No. 5,222,014.
Figure 2:
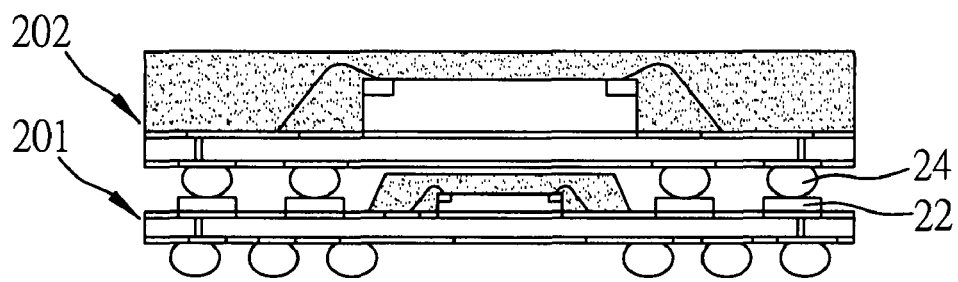
FIG. 2 (PRIOR ART) is a cross-sectional view of a stack structure of semiconductor packages disclosed in U.S. Pat. No. 6,987,314.
Figure 3:
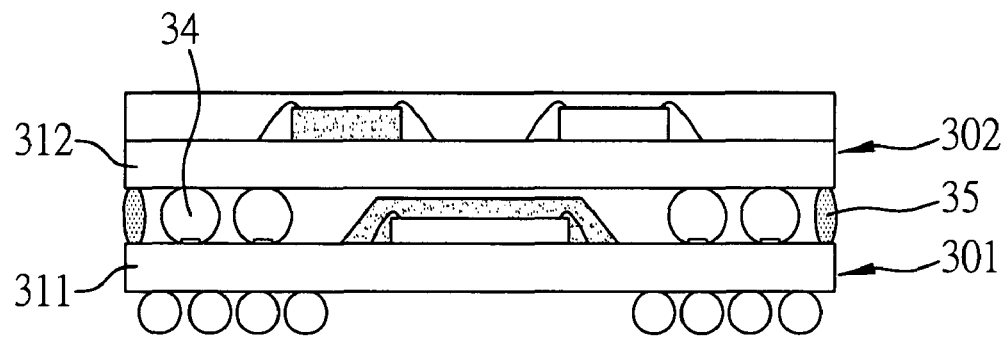
FIG. 3 (PRIOR ART) is a cross-sectional view of a stack structure of semiconductor packages disclosed in Taiwan Patent No. I250627.
Figure 4A:
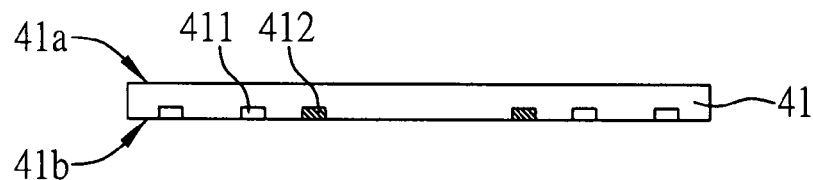
FIGS. 4A to 4D are cross-sectional views of a stack structure of semiconductor packages and a method for fabricating the stack structure in accordance with a first embodiment of the present invention.

As shown in FIG. 4A, a substrate 41 having a first surface 41a and a second surface 41b opposite to the first surface 41a is provided, wherein a plurality of electrical connection pads 411 and dummy pads 412 are formed on the second surface 41b of the substrate 41. The substrate 41 is a substrate of an upper semiconductor package that is to be subsequently stacked on a fabricated lower semiconductor package. The substrate 41 is, for example, a ball grid array (BGA) substrate.

Figure 5A:
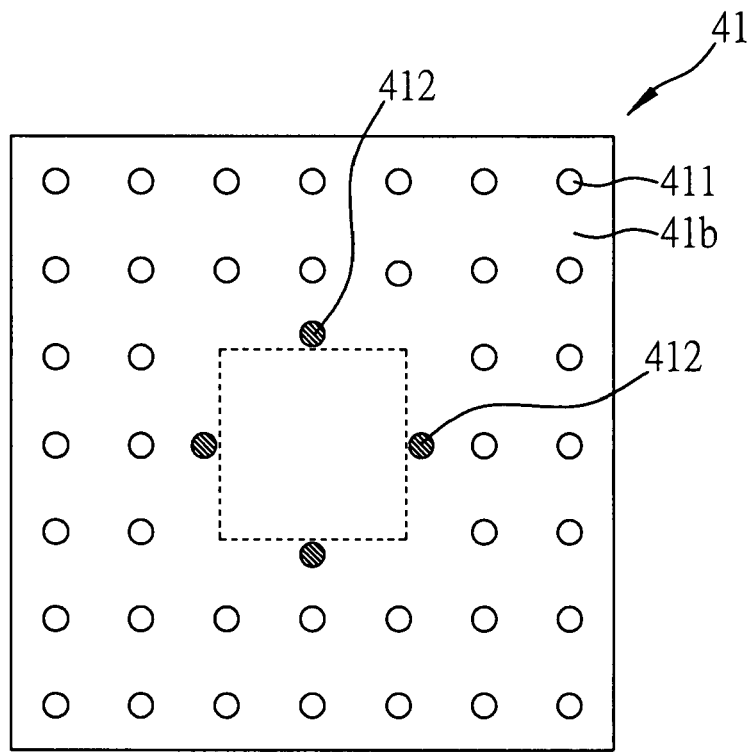
FIGS. 5A to 5C are schematic diagrams showing different examples of a substrate shown in FIG. 4A.

Also referring to FIG. 5A showing the second surface 41b of the substrate 41 of FIG. 4A, the plurality of electrical connection pads 411 serve as electrical input/output (I/O) pads and are peripherally located in a peripheral portion of the second surface 41b of the substrate 41, and the plurality of dummy pads 412 are located in a central portion of the second surface 41b of the substrate 41. Particularly, the dummy pads 412 are formed at positions correspond to those around an encapsulant (its projection to the second surface 41b is shown by the dashed lines) of the lower semiconductor package.

Figure 5B:
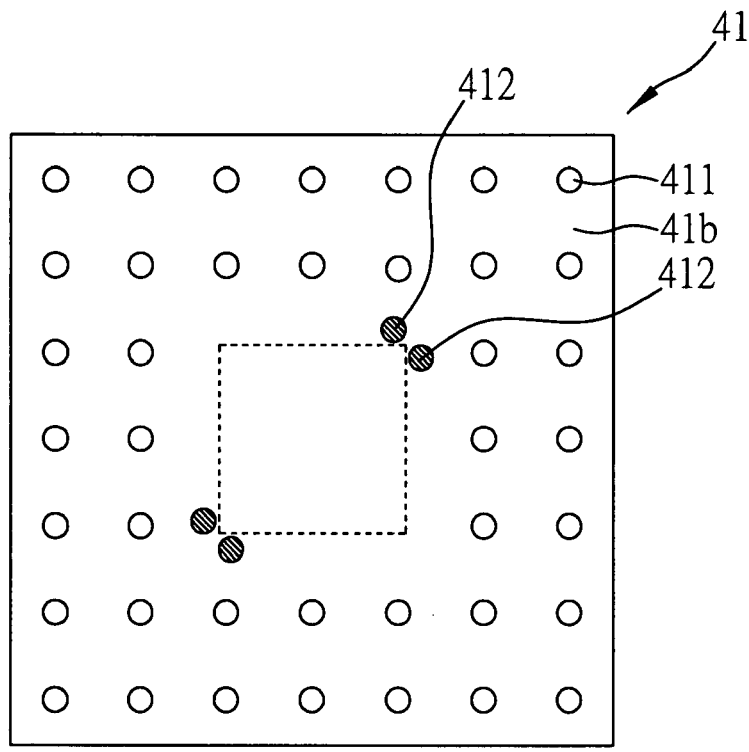
Figure 5C:
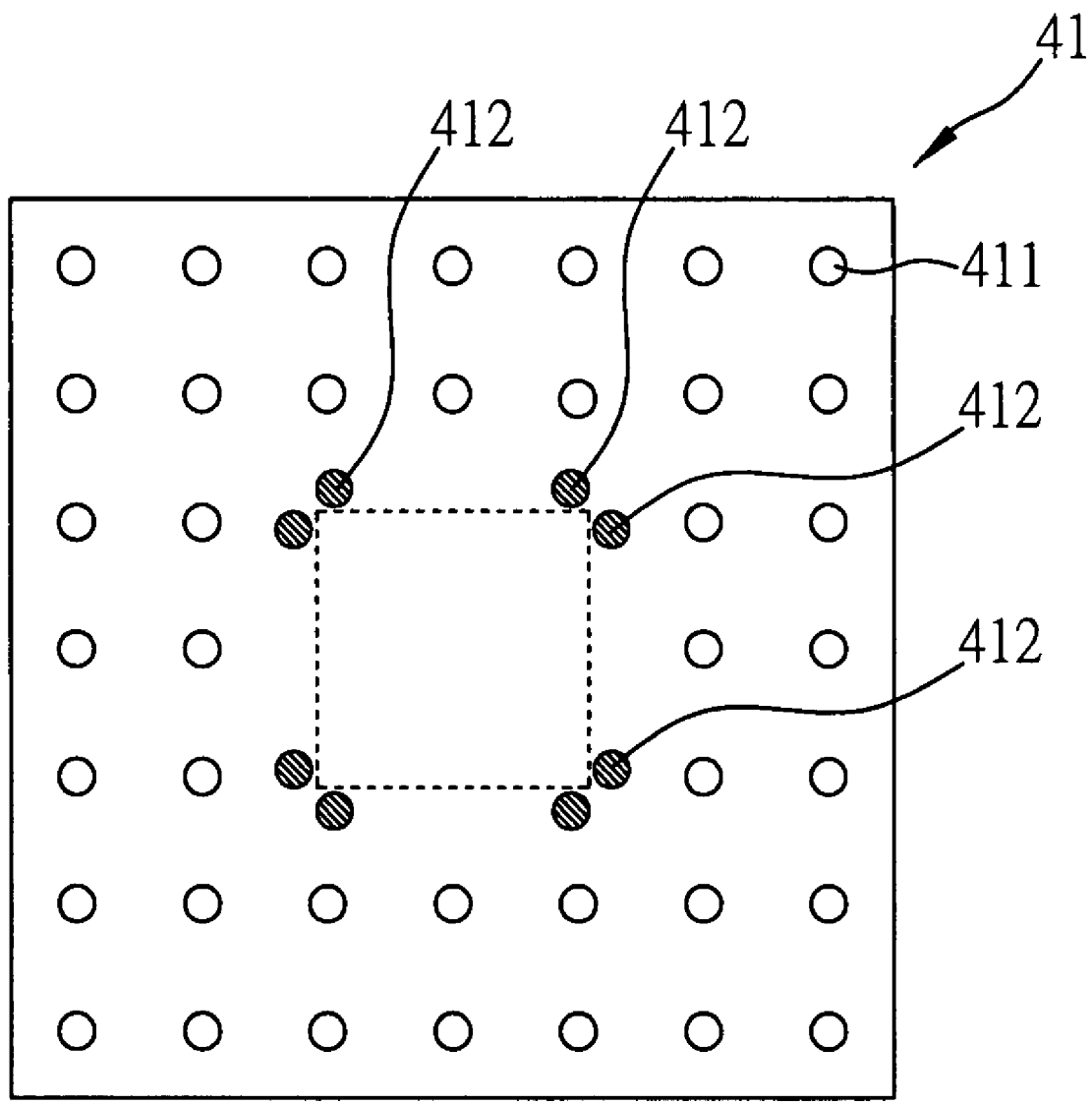

The dummy pads 412 can be adjusted in position and number flexibly as required in practical implementation, as long as at least one dummy pad 412 is provided at a position corresponding to that closely adjacent to each edge of the encapsulant of the lower semiconductor package. For example, the dummy pads 412 can be located at positions corresponding to those closely adjacent to a middle portion of each edge of the encapsulant (as shown in FIG. 5A), those closely adjacent to one end of each edge of the encapsulant (as shown in FIG. 5B), or those closely adjacent to two ends of each edge of the encapsulant (as shown in FIG. 5C), etc.

Figure 4B:
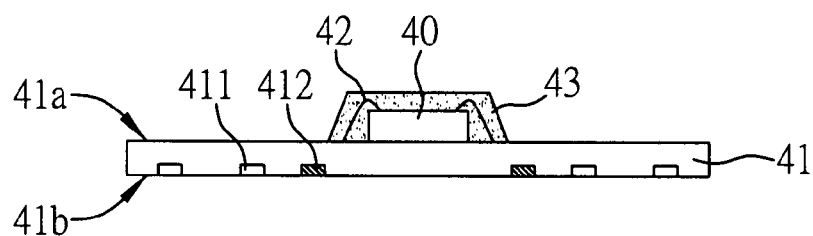

As shown in FIG. 4B, at least one semiconductor chip 40 is mounted on the first surface 41a of the substrate 41 and is electrically connected to the substrate 41 by a plurality of bonding wires 42. Then, an encapsulant 43 is formed on the first surface 41a of the substrate 41 to encapsulate the semiconductor chip 40 and the bonding wires 42.

Figure 4C:
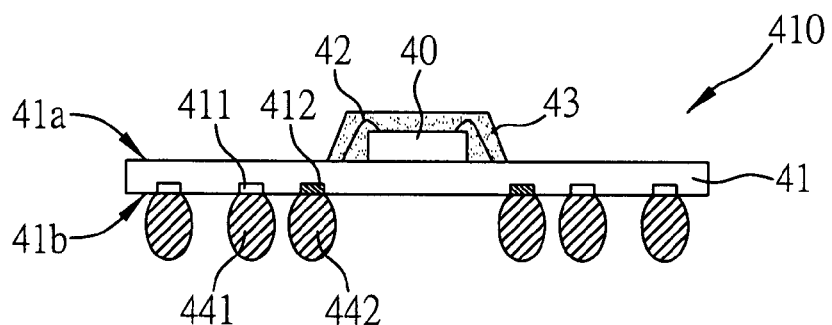

As shown in FIG. 4C, a plurality of solder balls 441, 442 are implanted to the electrical connection pads 411 and the dummy pads 412 on the second surface 41b of the substrate 41 respectively, so as to form the upper semiconductor package 410. The solder balls 442 implanted to the dummy pads 412 may have an approximately same size as that of the solder balls 441 implanted to the electrical connection pads 411.

Figure 4D:
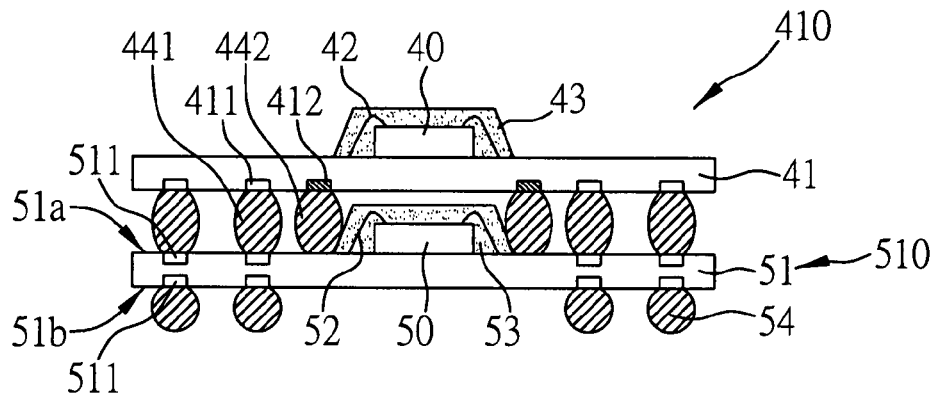

As shown in FIG. 4D, the upper semiconductor package 410 is mounted on the fabricated lower semiconductor package 510.

The lower semiconductor package 510 comprises a substrate 51, a semiconductor chip 50 mounted on and electrically connected to the substrate 51, and an encapsulant 53 formed on the substrate 51 and encapsulating the semiconductor chip 50. The substrate 51 of the lower semiconductor package 510 comprises a first surface 51a and a second surface 51b opposite to the first surface 51a. A plurality of electrical connection pads 511 are formed on the first and second surfaces 51a, 51b of the substrate 51. The semiconductor chip 50 is mounted on the first surface 51a of the substrate 51 and is electrically connected to the substrate 51 by a plurality of bonding wires 52.

The solder balls 441 implanted to the electrical connection pads 411 of the upper semiconductor package 410 are electrically connected to the electrical connection pads 511 on the first surface 51a of the substrate 51 of the lower semiconductor package 510 by a reflow process. The solder balls 442 implanted to the dummy pads 412 of the upper semiconductor package 410 surround and confine the encapsulant 53 of the lower semiconductor package 510. This forms a stack structure of semiconductor packages. Further, a plurality of solder balls 54 can be implanted to the electrical connection pads 511 on the second surface 51b of the lower semiconductor package 510, so as to electrically connect the stack structure of semiconductor packages to an external device.

It is to be noted that, the semiconductor package stacking process may be continued to stack more semiconductor packages on the stack structure, and the number of semiconductor packages stacked is not limited to two shown in the drawings here.

In accordance with the above fabrication method, the present invention also discloses a stack structure of semiconductor packages. The stack structure comprises a lower semiconductor package 510 and at least one upper semiconductor package 410 mounted on the lower semiconductor package 510. The lower semiconductor package 510 comprises a substrate 51, a semiconductor chip 50 mounted on and electrically connected to the substrate 51, and an encapsulant 53 formed on the substrate 51 and encapsulating the semiconductor chip 50. The upper semiconductor package 410 comprises a substrate 41 having a first surface 41a and a second surface 41b opposite to the first surface 41a, a semiconductor chip 40 mounted on and electrically connected to the first surface 41a of the substrate 41, a plurality of electrical connection pads 411 and dummy pads 412 formed on the second surface 41b of the substrate 41, and a plurality of solder balls 441, 442 implanted to the electrical connection pads 411 and the dummy pads 412 respectively. The upper semiconductor package 410 is electrically connected to the substrate 51 of the lower semiconductor package 510 by the solder balls 441 implanted to the electrical connection pads 411 of the upper semiconductor package 410. The solder balls 442 implanted to the dummy pads 412 of the upper semiconductor package 410 surround and confine the encapsulant 53 of the lower semiconductor package 510. By such arrangement, the upper and lower semiconductor packages can be efficiently and properly positioned with respect to each other.

Second Embodiment

Figure 6A:
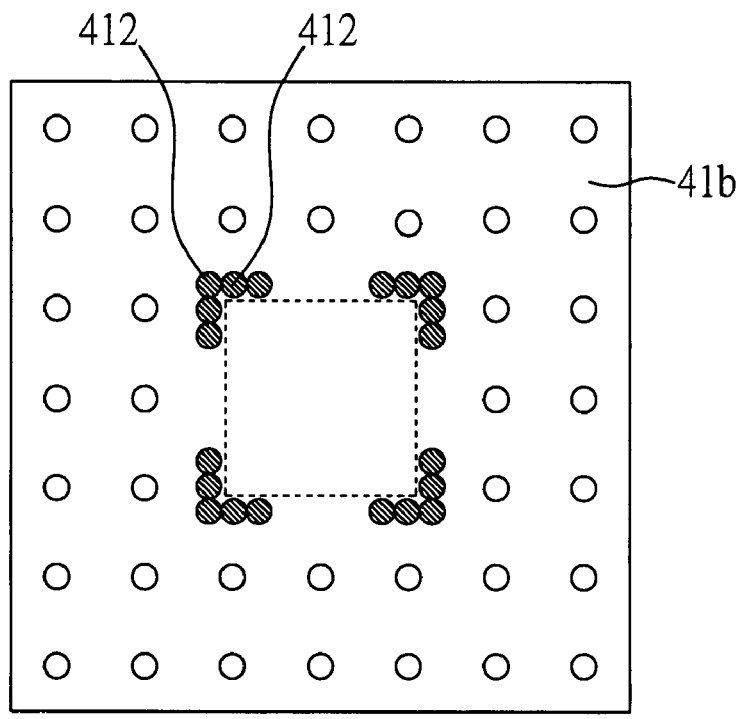
FIGS. 6A to 6B are bottom views of a substrate of an upper semiconductor package of a stack structure in accordance with a second embodiment of the present invention.
Figure 6B:
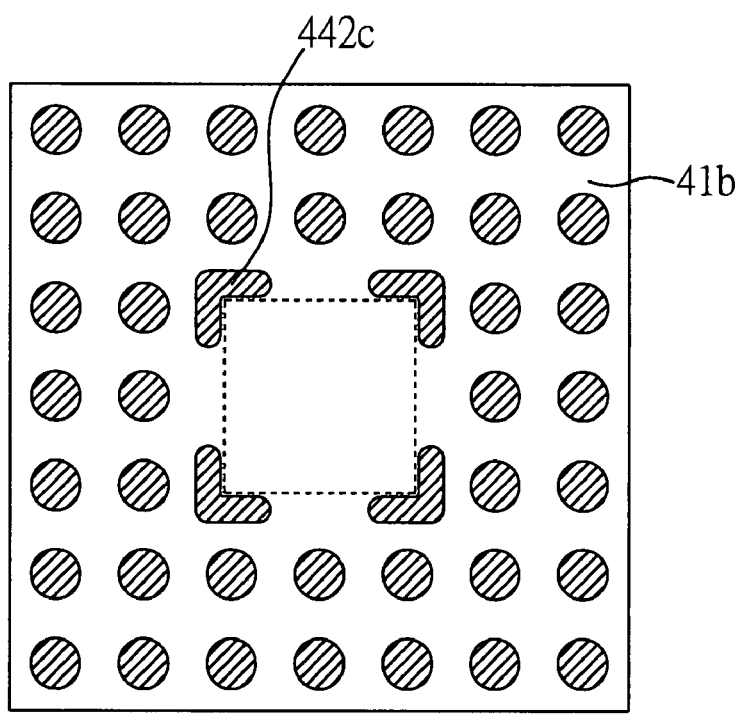

FIGS. 6A and 6B show a second surface of a substrate of an upper semiconductor package in accordance with a second embodiment of the present invention.

A stack structure of semiconductor packages and a method for fabricating the stack structure in the second embodiment are similar to those in the aforementioned first embodiment, with a primary difference in that, as shown in FIGS. 6A and 6B for the second embodiment, the dummy pads 412 formed on the second surface 41b of the substrate of the upper semiconductor package are located at positions corresponding to those closely adjacent to corners of the encapsulant (its projection to the second surface 41b is shown by the dashed lines) of the lower semiconductor package and further extended along the edges forming the corners of the encapsulant, thereby forming a continuous arrangement of the dummy pads 412 around each corner of the region encompassed by the dashed lines shown in FIG. 6A. As such, the solder balls, which are subsequently implanted to the dummy pads of the upper semiconductor package and reflowed to be bonded to the lower semiconductor package, form a dam structure 442c around each of the corners of the encapsulant of the lower semiconductor package. Thus, the upper semiconductor package can be properly mounted and effectively confined in position on the lower semiconductor package.

Third Embodiment

Figure 7:
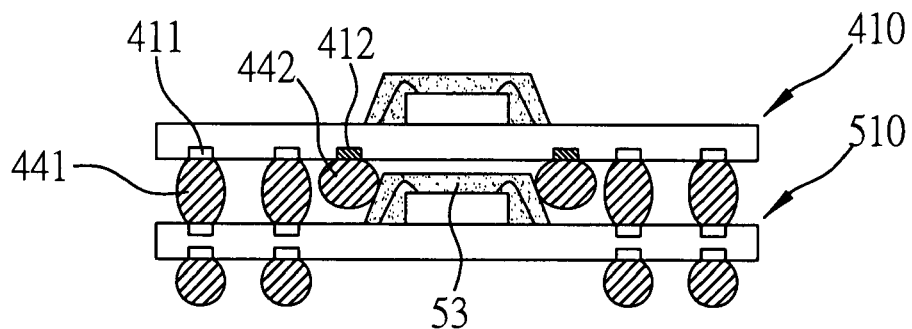
FIG. 7 is a cross-sectional view of a stack structure of semiconductor packages in accordance with a third embodiment of the present invention.

FIG. 7 is a cross-sectional view of a stack structure of semiconductor packages in accordance with a third embodiment of the present invention.

The stack structure of semiconductor packages of the third embodiment is similar to those of the aforementioned embodiments, with a primary difference in that, as shown in FIG. 7 for the third embodiment, the solder balls 442 implanted to the dummy pads 412 of the second surface 41b of the substrate of the upper semiconductor package 410 are smaller in size than the solder ball 441 implanted to the electrical connection pads 411, as long as the solder balls 422 implanted to the dummy pads 412 can surround and confine the encapsulant 53 of the lower semiconductor package 510, so as to prevent misalignment between the upper and lower semiconductor packages 410, 510.

Fourth Embodiment

Figure 8:
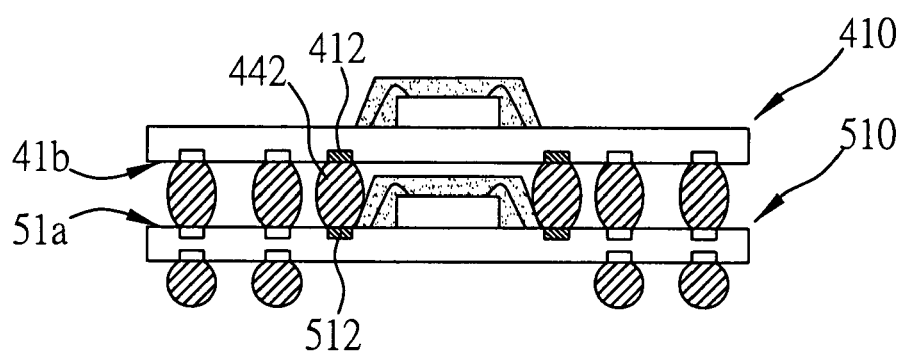
FIG. 8 is a cross-sectional view of a stack structure of semiconductor packages in accordance with a fourth embodiment of the present invention.

FIG. 8 is a cross-sectional view of a stack structure of semiconductor packages in accordance with a fourth embodiment of the present invention.

The stack structure of semiconductor packages of the fourth embodiment is similar to those of the aforementioned embodiments, with a primary difference in that, as shown in FIG. 8 for the fourth embodiment, there are also formed dummy pads 512 on the first surface 51a of the substrate of the lower semiconductor package 510, and the dummy pads 512 correspond in position to the dummy pads 412 on the second surface 41b of the substrate of the upper semiconductor package 410. As such, the solder balls 442 implanted to the dummy pads 412 of the upper semiconductor package 410 are connected to the dummy pads 512 of the lower semiconductor package 510, thereby strengthening the bonding between the upper and lower semiconductor packages 410, 510.

Fifth Embodiment

Figure 9:
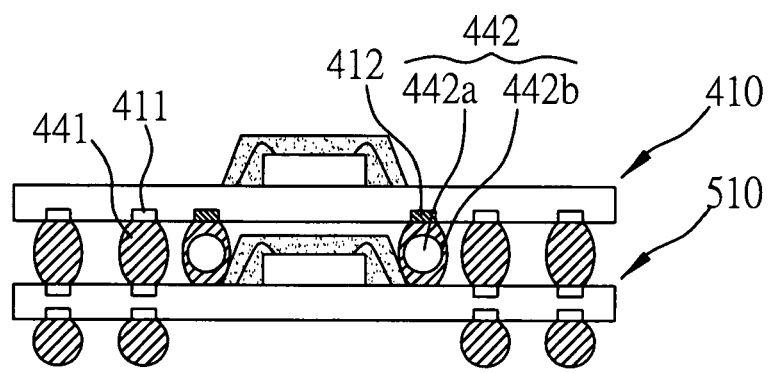
FIG. 9 is a cross-sectional view of a stack structure of semiconductor packages in accordance with a fifth embodiment of the present invention.

FIG. 9 is a cross-sectional view of a stack structure of semiconductor packages in accordance with a fifth embodiment of the present invention.

The stack structure of semiconductor packages of the fifth embodiment is similar to those of the aforementioned embodiments, with a primary difference in that, as shown in FIG. 9 for the fifth embodiment, each of the solder balls 442 implanted to the dummy pads 412 of the upper semiconductor package 410 comprises a core portion 442a and a peripheral portion 442b The core portion 442a is made of copper, lead or polymer, and the peripheral portion 442b is made of a solder material. The core portions 442a of the solder balls 442 implanted to the dummy pads 412 have a higher melting point than that of the solder balls 441 implanted to the electrical connection pads 411, so as to assure that the solder balls 442 implanted to the dummy pads 412 can effectively surround and confine the encapsulant of the lower semiconductor package 510.

The solder balls 442 implanted to the dummy pads 412 of the upper semiconductor package 410 can also be made of alloy having a melting point higher than that of the solder balls 441 implanted to the electrical connection pads 411. The alloy is, for example, high-lead alloy having a lead/tin (Pb/Sn) ratio of 90/10 or 95/5, or lead-free alloy having a tin/silver/copper (Sn/Ag/Cu) ratio of 96.5/3/0.05, etc.

Therefore, in the stack structure of semiconductor packages and the method for fabricating the stack structure according to the present invention, a plurality of electrical connection pads serving as electrical input/output (I/O) pads and a plurality of dummy pads are formed on the second surface of the upper semiconductor package, wherein the positions of the dummy pads correspond to those around the encapsulant of the lower semiconductor package. Thus, when the upper semiconductor package is mounted on the lower semiconductor package, the upper semiconductor package can be electrically connected to the lower semiconductor package by the solder balls implanted to the electrical connection pads, and the encapsulant of the lower semiconductor package can be surrounded and confined by the solder balls implanted to the dummy pads, so as to effectively and properly position the upper semiconductor package on the lower semiconductor package, thereby avoiding misalignment during a reflow process and electrical connection failure for stacking semiconductor packages in the prior art.

Moreover, the solder balls on the dummy pads to form the positioning mechanism are implanted together with the solder balls on the electrical connection pads, such that no additional fabrication process is required. Compared with the prior art using a pre-solder material provided on the substrate of the lower semiconductor package, or applying infrared paste between the substrates of the upper and lower semiconductor package and performing infrared irradiation so as to positioning the stacked upper and lower semiconductor packages, the present invention without the use of the pre-solder material, infrared paste and infrared irradiation, effectively avoids increase in the fabrication costs and complexity of the fabrication processes.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A stack structure of semiconductor packages, comprising:
a lower semiconductor package comprising a substrate, a semiconductor chip mounted on and electrically connected to the substrate, and an encapsulant formed on the substrate and encapsulating the semiconductor chip; and
an upper semiconductor package mounted on the lower semiconductor package, wherein the upper semiconductor package comprises a substrate having a first surface and a second surface opposite to the first surface, a semiconductor chip mounted on and electrically connected to the first surface of the substrate, a plurality of electrical connection pads and dummy pads formed on the second surface of the substrate, and a plurality of solder balls implanted to the electrical connection pads and the dummy pads, wherein the upper semiconductor package is electrically connected to the substrate of the lower semiconductor package by the solder balls implanted to the electrical connection pads of the upper semiconductor package, and the encapsulant of the lower semiconductor package is surrounded and confined by the solder balls implanted to the dummy pads of the upper semiconductor package,
wherein at least one of the dummy pads of the second surface of the substrate of the upper semiconductor package is located at a position corresponding to that closely adjacent to one of a middle portion, one end, and two ends of each edge of the encapsulant of the lower semiconductor package, so that the solder balls implanted to the dummy pads contact the encapsulant of the lower semiconductor package, and
wherein the dummy pads are provided with the solder pads for supporting the upper semiconductor package only and are free from electrical connection.

2. The stack structure of semiconductor packages of claim 1, wherein the lower semiconductor package further comprises a plurality of solder balls implanted to a surface of the substrate free of being mounted with the semiconductor chip.

3. The stack structure of semiconductor packages of claim 1, wherein the electrical connection pads are formed in a peripheral portion of the second surface of the substrate of the upper semiconductor package and serve as electrical input/output pads, and the dummy pads are formed on the second surface of the substrate of the upper semiconductor package and are located at positions corresponding to those around the encapsulant of the lower semiconductor package.

4. The stack structure of semiconductor packages of claim 1, wherein the solder balls implanted to the dummy pads are dimensionally smaller than or equal to the solder balls implanted to the electrical connection pads of the upper semiconductor package.

* * * * *